US010115775B2

(12) United States Patent
Wang

(10) Patent No.: US 10,115,775 B2
(45) Date of Patent: Oct. 30, 2018

(54) OLED DISPLAY DEVICE AND MANUFACTURING METHOD THEREOF, AND DISPLAY APPARATUS

(71) Applicant: BOE TECHNOLOGY GROUP CO., LTD., Beijing (CN)

(72) Inventor: Huifeng Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 45 days.

(21) Appl. No.: 14/439,915

(22) PCT Filed: Aug. 15, 2014

(86) PCT No.: PCT/CN2014/084534
§ 371 (c)(1),
(2) Date: Apr. 30, 2015

(87) PCT Pub. No.: WO2015/149467
PCT Pub. Date: Oct. 8, 2015

(65) Prior Publication Data
US 2016/0254331 A1  Sep. 1, 2016

(30) Foreign Application Priority Data

Apr. 1, 2014  (CN) .......................... 2014 1 0129206

(51) Int. Cl.
*H01L 27/32* (2006.01)
*H01L 21/027* (2006.01)
*H01L 51/00* (2006.01)

(52) U.S. Cl.
CPC ...... *H01L 27/3246* (2013.01); *H01L 51/0005* (2013.01); *H01L 2227/323* (2013.01)

(58) Field of Classification Search
CPC ........... H01L 27/3246; H01L 2227/323; H01L 51/0005; G03F 7/2022; G03F 7/203
See application file for complete search history.

(56) References Cited

U.S. PATENT DOCUMENTS 5,701,055 A * 12/1997 Nagayama .......... H01L 27/3246
313/504
6,762,552 B1 * 7/2004 Duineveld .......... H01L 27/3283
313/504
(Continued)

FOREIGN PATENT DOCUMENTS

CN  101626029 A  1/2010
CN  101740607 A  6/2010
(Continued)

OTHER PUBLICATIONS

Jan. 4, 2015—(WO) International Search Report—App PCT/CN2014/084534—Eng Tran.
Jan. 27, 2016—(CN) Office Action App No. 201410129206.4.

*Primary Examiner* — Nishath Yasmeen
(74) *Attorney, Agent, or Firm* — Banner & Witcoff, Ltd.

(57) ABSTRACT

An OLED display device and manufacturing method thereof are provided. The method comprises: forming an array comprising first electrodes on a base substrate, with an area to which the first electrodes correspond being a display area; forming pixel defining layers respectively between the first electrodes so that a width of a cross section of each pixel defining layer is relatively larger at a middle portion and reduced gradually towards an upper portion and a lower portion; forming organic light-emitting layers respectively on the first electrodes between the pixel defining layers; and at least forming a second electrode which is at least provided on the organic light-emitting layers. The OLED display device made in this method can minimize the coffee ring effect of the organic light-emitting layers, avoid the layer-broken phenomenon occurring to the second electrode, and thus improve the display quality and save the material for the second electrode.

11 Claims, 5 Drawing Sheets

(56) References Cited

U.S. PATENT DOCUMENTS

| | | | |
|---|---|---|---|
| 2007/0176545 A1* | 8/2007 | Kanoh | H01L 27/3246 313/506 |
| 2010/0029028 A1 | 2/2010 | Song et al. | |
| 2010/0213449 A1* | 8/2010 | Yamamoto | H01L 27/3283 257/40 |
| 2012/0326201 A1* | 12/2012 | Ohnuma | H01L 51/0085 257/99 |
| 2013/0119413 A1* | 5/2013 | Harada | H01L 51/5048 257/88 |
| 2013/0140589 A1 | 6/2013 | Kwak | |
| 2013/0228801 A1 | 9/2013 | Lee | |
| 2014/0077182 A1 | 3/2014 | Kim et al. | |

FOREIGN PATENT DOCUMENTS

| | | |
|---|---|---|
| CN | 102893424 A | 1/2013 |
| CN | 102969333 A | 3/2013 |
| CN | 103022079 A | 4/2013 |
| CN | 103094491 A | 5/2013 |
| CN | 103413819 A | 11/2013 |
| CN | 103928497 A | 7/2014 |
| CN | 203787433 U | 8/2014 |

\* cited by examiner

OLED DISPLAY DEVICE AND MANUFACTURING METHOD THEREOF, AND DISPLAY APPARATUS

The application is a U.S. National Phase Entry of International Application No. PCT/CN2014/084534 filed on Aug. 15, 2014, designating the United States of America and claiming priority to Chinese Patent Application No. 201410129206.4 filed on Apr. 1, 2014. The present application claims priority to and the benefit of the above-identified applications and the above-identified applications are incorporated by reference herein in their entirety.

TECHNICAL FIELD

At least one embodiment of the present disclosure relates to an OLED display device and a manufacturing method thereof, and a display apparatus.

BACKGROUND

Compared with LCD (liquid crystal display), organic light-emitting diode (OLED) is advantageous in being self-luminous, quick response, wide viewing angle, high brightness, vivid color, being light and thin, and so on, and is deemed as the next generation display technology.

Film formation of the OLED material mainly includes evaporation process and solution process. The evaporation process is mature in small size application, and currently this technology has been used in mass production. The solution process for film formation of the OLED material includes inkjet printing, spray coating, spin coating, screen printing, and so on. Among these film formation methods, the inkjet printing technology is expected to be the main method for achieving mass production of the large size OLED due to its higher material utilization and its ability of achieving large size.

In the inkjet printing process, it is necessary to form pixel defining layers (PDL) on electrodes of a substrate in advance, to define ink droplets of the organic light-emitting material to precisely flow into a designated R/G/B sub pixel areas.

The cross section shape of the PDL structure may have two kinds, including regular trapezoid shape (as shown in FIG. 1) and inverted trapezoid shape (as shown in FIG. 2). The regular trapezoid shaped structure illustrated in FIG. 1 is widely used, with an array of first electrodes 120 on a planarization layer 110 and the PDLs 130 are arranged between the first electrodes 120. FIG. 2 shows another structure in which an array of the first electrodes 220 is arranged on a planarization layer 210, the PDLs 230 are arranged between the first electrodes 220, and each of the PDLs 230 has the inverted trapezoid structure.

SUMMARY

At least one embodiment of the present disclosure provides an OLED display device and a manufacturing method thereof, and a display apparatus, so that the manufactured OLED display device has a minimized coffee ring effect on organic light-emitting layers, avoids the layer-broken phenomenon occurring to a second electrode, thus improves the display effect and saves the material for the second electrode.

At least one embodiment of the present disclosure provides a method for manufacturing an OLED display device, and the method includes: forming an array including first electrodes on a base substrate with an area to which the first electrodes correspond being a display area; forming pixel defining layers respectively between the first electrodes so that a width of a cross section of each pixel defining layer is relatively larger at a middle portion and gradually reduced towards an upper portion and a lower portion; forming organic light-emitting layers respectively on the first electrodes between the pixel defining layers; and forming a second electrode which is at least provided on the organic light-emitting layers.

At least one embodiment of the present disclosure further provides an OLED display device, the OLED display device includes an array of first electrodes, pixel defining layers, organic light-emitting layers and a second electrode, the pixel defining layers are respectively arranged between the first electrodes, and the organic light-emitting layers and the second electrode are successively arranged on the array of the first electrodes. A width of a cross section of each pixel defining layer is relatively larger at a middle portion and gradually reduced towards an upper portion and a lower portion.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 4b is a schematic view for illustrating a structure obtained after a layer of photoresist is formed on the basis of FIG. 4a;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
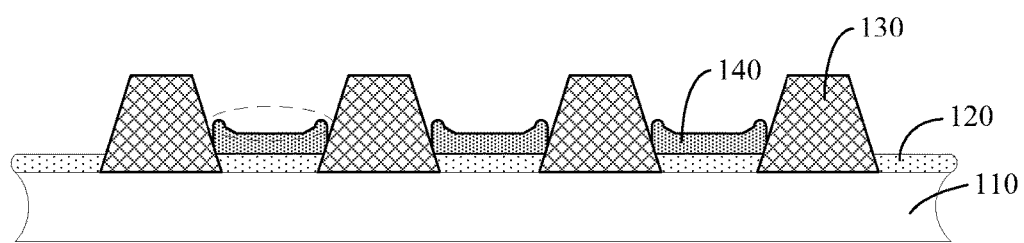
FIG. 1 is a schematic view for illustrating a structure of an OLED display device.
Figure 2:
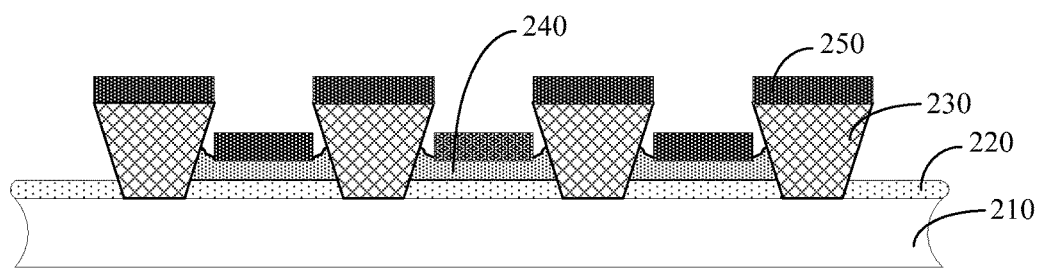
FIG. 2 is a schematic view for illustrating a structure of another OLED display device.

The inventor of the present application noted that in the case as shown in FIG. 1, at the position where the ink droplets of the organic light-emitting material 140 contact with the PDL 130 having a regular trapezoid shape, due to the surface energy difference therebetween and due to the self-drying behavior of the organic light-emitting material 140, it is easy to form an uneven film having a high edge portion and a thin central portion after drying, as shown by dashed box in FIG. 1, that is, the coffee ring effect. If it is intended to avoid the coffee ring effect, it is necessary not only to use a PDL material having good performance and to finely adjust solvent constitution for the ink, but also to precisely control the film forming conditions such as temperature, pressure, atmosphere, and so on at which the ink droplets are dried, and this increases the cost of the display device and the difficulty for researching and developing the same. In the case as shown in FIG. 2, the PDL 230 is of an inverted trapezoid shape, since the angle formed between the PDL 230 with the inverted trapezoid shape and the electrode is smaller than 90 degree, capillary structures may exist, the ink droplets of the organic light-emitting material 240 are evenly spread under the effect of the edge capillary structures, and this reduces the difficulty for developing the form filming process greatly. But on the other hand, when the cathodes 250 are deposited, with the inverted trapezoid structures, it is easily to cause the cathodes to be layer-broken, thus to result in circuit break defects in cathode pixels, especially when the thickness of the cathode 250 is insufficient to flatten concave portions between the PDLs 230. In order to prevent the layer-break phenomenon of the cathodes, generally, it is necessary to evaporate the cathodes 250 with tens of times the thickness to flatten the concave portions, and this significantly increases the time and cost for manufacturing the device, and also reduces the transparency of the device.

Figure 3:
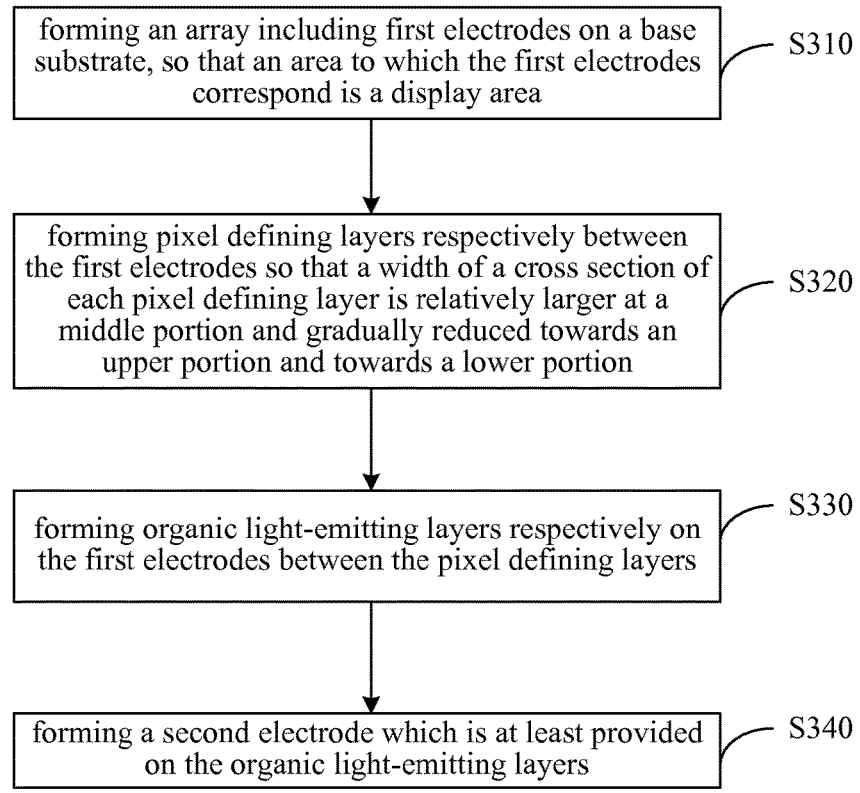
FIG. 3 is a flow chart showing a method for manufacturing an OLED display device according to an embodiment of the present disclosure.

At least one embodiment of the present disclosure provides a method for manufacturing an OLED display device, as shown in FIG. 3, the method includes the following steps.

Step S310: forming an array including first electrodes on a base substrate, so that an area to which the first electrodes correspond is a display area.

Step S320: forming pixel defining layers respectively between the first electrodes so that a width of a cross section of each pixel defining layer is relatively larger at a middle portion and gradually reduced towards an upper portion and towards a lower portion.

Step S330: forming organic light-emitting layers respectively on the first electrodes between the pixel defining layers.

Step S340: forming a second electrode which is at least provided on the organic light-emitting layers.

Figure 4A:
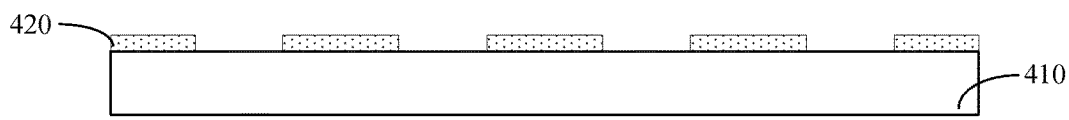
FIG. 4a is a schematic view for illustrating a structure of forming an array of first electrodes on a planarization layer in a method for manufacturing an OLED display device according to an embodiment of the present disclosure.

In one embodiment, for example, the step S310 is shown in FIG. 4a, a pattern including the array of the first electrodes 420 is formed on the base substrate. For the OLED display device, generally, the base substrate is formed with an array of thin film transistor (TFT) structures and a planarization layer on the array of TFT structures, and the array of the first electrodes is formed on the planarization layer and is connected with the TFTs through via holes. As shown in FIG. 4a, the pattern of the planarization layer 410 and the array of the first electrodes 420 on the planarization layer 410 is shown. The first electrodes 420 generally are anode, and are connected to drain electrodes of the driving TFTs in the TFT structures. The area that the first electrodes 420 correspond to is a display area, and after an organic light-emitting material and a second electrode (generally cathode) are formed in the following processes, the area emits light to display.

The first electrodes formed on the planarization layer 410 (generally resin material) may be formed by a patterning process, that is, a photoresist is formed on the surface of the first electrode 420 thin film and is exposed and developed by using a mask plate, then the exposed first electrode thin film is etched and finally the array of the first electrodes is formed. The OLED device has two kinds of emitting mode, that is, bottom emission and top emission, the bottom-emission structure of the device can be formed by providing a transparent anode and a reflective cathode structure, and to the contrary, the top-emission structure can be formed by providing a transparent cathode and a reflective anode structure. Therefore, according to different structures of the devices, the material for the anode is differently selected, generally, the transparent or translucent material having high work function, such as ITO, Ag, NiO, Al, graphene, or the like, can be used.

In one embodiment, for the step S320, two different manufacturing methods are provided to form the pixel defining layer so that the width of the cross section of the pixel defining layer is relatively larger at the middle portion and gradually reduced towards the upper portion and the lower portion.

Method I

Figure 4B:
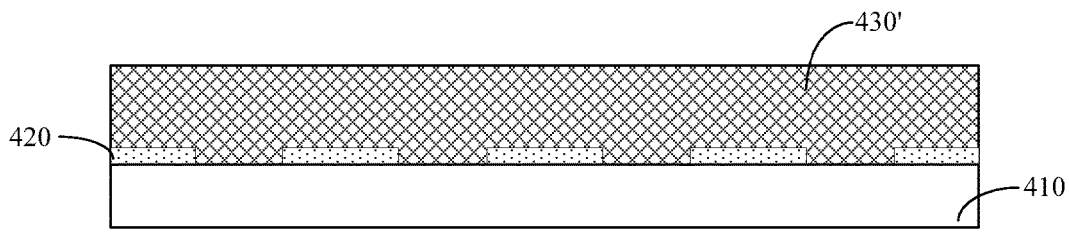

As shown in FIG. 4b, after the first electrodes 420 are formed on the base substrate, a layer of photoresist 430' is formed on the substrate. The methods for forming the photoresist 430' includes spin coating, knife coating, and so on, and the thickness of the photoresist may be from 0.1 μm to 100 μm, e.g. from 1 μm to 5 μm.

Figure 4C:
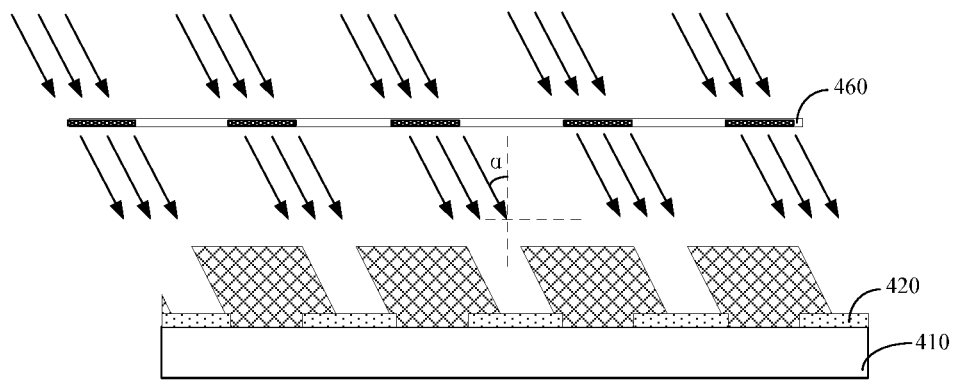
FIG. 4c is a schematic view for illustrating a structure obtained after the photoresist is subjected to first exposure by using a certain exposure manner on the basis of FIG. 4b.

As shown in FIG. 4c, light which passes through a mask plate is irradiated onto the photoresist 430' at a predetermined first incident angle α with respect to a direction perpendicular to the base substrate, where 0°<α<90°, e.g. 45°<α<75°, so as to facilitate the process. The photoresist 430' is subjected to first exposure, during which the photoresist, e.g. is a positive photoresist. The light is irradiated onto the corresponding photoresist 430' in a display area at the angel α. Because the light is irradiated obliquely, the unexposed photoresist has a cross section in parallelogram shape, and an angle formed between one of its sides and the first electrodes 420 is 90°-α in theory.

Figure 4D:
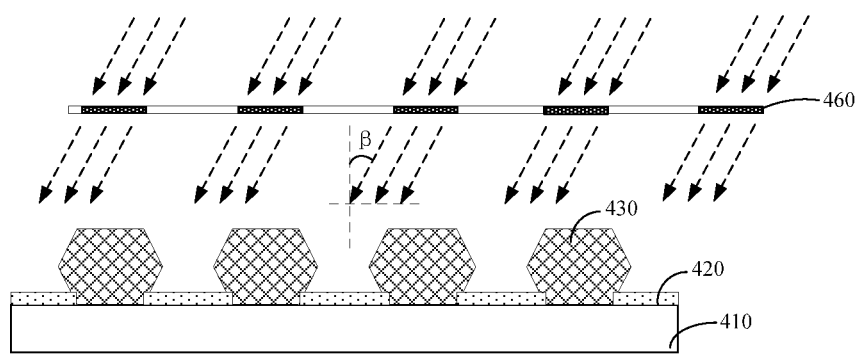
FIG. 4d is a schematic view for illustrating a structure of cross sections of pixel defining layers which each have a cross section in hexagonal shape and are formed after second exposure is performed to the photoresist on the basis of FIG. 4c.

As shown in FIG. 4*d*, then, light which passes through the mask plate is irradiated onto the photoresist, which is not exposed in the first exposure, at a predetermined second incident angle β (0°<β<90°) with respect to the direction perpendicular to the base substrate.

Then, the photoresist which is subjected to twice exposure processes is collectively developed to remove the photoresist corresponding to the display area and further to expose the first electrodes 420. Of course, as shown in FIG. 4*c* and FIG. 4*d*, it is also possible to perform one development after every exposure. In order to render the width of the cross section of the pixel defining layer to be relatively larger at the middle portion and gradually reduced towards the upper portion and the lower portion, a line in which the incident direction of the light in the first exposure is located and a line in which the incident direction of the light in the second exposure is located are respectively arranged at the opposite sides of a normal line passing through the center of an exposed first electrode 420. Thus, after twice exposure processes, the photoresist in the unexposed area has cross sections in quasi-hexagonal shapes (that is, the shape of each pixel defining layer is similar to a hexagonal prism), and in theory, by precisely controlling the light, the pixel defining layer can have a hexagonal shape.

During the twice exposure processes, by controlling the intensity of the light so that the energy of the light is gradually increased and the attenuation of the energy of the light is avoided, the oblique surfaces formed on the photoresist after exposure and development are relative flat, and the angles formed between the oblique surfaces and the surfaces of the first electrodes 420 respectively approach 90°-α and 90°-β. In one embodiment, the line in which the incident direction of the light in the first exposure is located and the line in which the incident direction of the light in the second exposure is located are symmetrical with respect to the normal line passing through the center of the exposed first electrode 420, that is, the angel α is equal to the angle β, and this facilitates to control the cross section of the resultant pixel defining layer 430 to be of a quasi-hexagonal structure.

Method II (Using Positive Photoresist)

As shown in FIG. 4*b*, after the first electrodes 420 are formed on the base substrate, a layer of photoresist 430' is formed on the base substrate. The method for forming the photoresist 430' includes spin coating, slitting, and so on, and the thickness of the photoresist may be from 0.1 μm to 100 μm, e.g. from 1 μm to 5 μm.

Figure 4E:
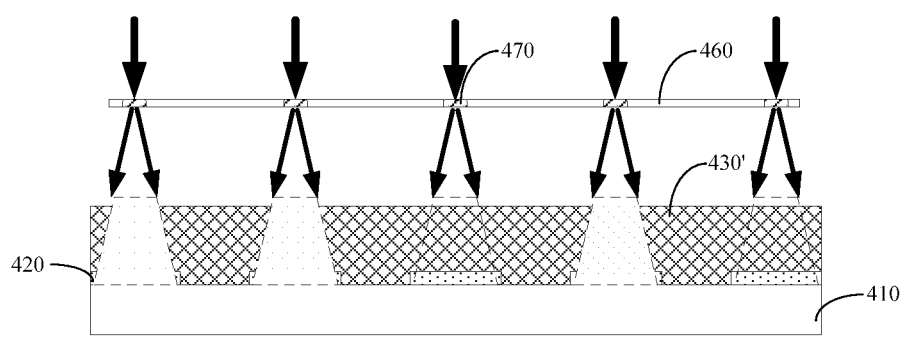
FIG. 4e is a schematic view for illustrating a structure obtained after the photoresist is subjected to first exposure by another exposure manner on the basis of FIG. 4b.

As shown in FIG. 4*e*, light is diffracted after the light passes through holes in a mask plate 460, and this can be achieved by providing a diffraction sheet 470 in the through holes. The diffracted light can scatter at a certain angle, as shown in FIG. 4*e* by arrow and dashed box (the dashed box shows the range of lighting). The diffracted light is incident on the photoresist 430' corresponding to the display area, first exposure is performed to the photoresist 430', and the unexposed portions of the photoresist each have a cross section in inverted trapezoid shape.

Figure 4F:
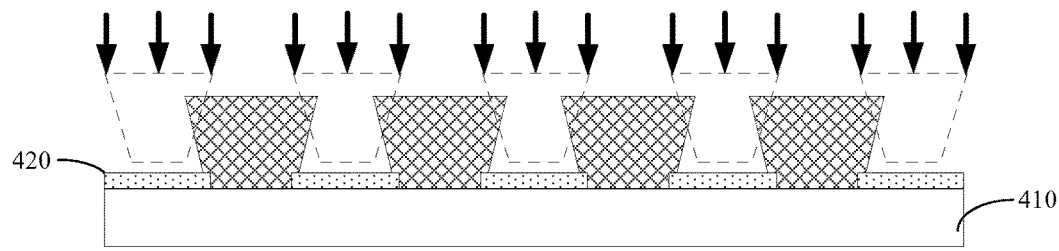
FIG. 4f is a schematic view for illustrating a structure of cross sections of pixel defining layers which each have a cross section in hexagonal shape and are formed after second exposure is performed to the photoresist on the basis of FIG. 4e.

As shown in FIG. 4*f*, by irradiating two base-angle portions at the upper bottom (located on the upper portion is the upper bottom) of the photoresist which has an inverted-trapezoidal cross section, the photoresist is subjected to second exposure. Because the energy of the light can attenuate by itself or by manually controlling, or by providing lenses in the through holes of the mask plate so that the light has the trend as shown by the dashed box in FIG. 4*f*. Finally, after one development, the width of the cross section of the resultant pixel defining layer is relatively larger at the middle portion and reduced gradually towards the upper portion and the lower portion.

Of course, the light can be controlled during the two exposure processes, to finally form the pixel defining layers 430 each having a quasi-hexagonal shaped (hexagon shape can be formed in theory) cross section, as shown in FIG. 4*d*. In addition, it is possible to perform one development after every exposure, as shown in FIG. 4*e* and FIG. 4*f*.

Figure 4G:
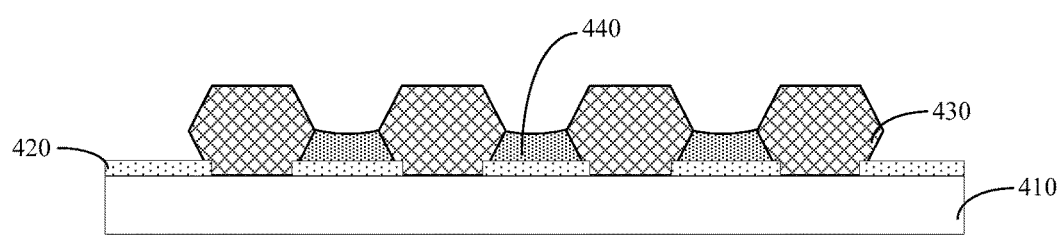
FIG. 4g is a schematic view for illustrating a structure obtained after an organic light-emitting material is formed on the first electrodes between the pixel defining layers on the basis of FIG. 4e.

Step S330: as shown in FIG. 4*g*, forming organic light-emitting layers 440 respectively on the first electrodes 420 between the pixel defining layers 430. Generally, an organic light-emitting layer 440 comprises one or more layers selected from the group consisting of a hole injection layer, a hole transport layer, a light-emitting layer, a hole barrier layer, an electron barrier layer, an electron transport layer, an electron injection layer, and so on, or is in a white-light structure formed by connecting the above organic light-emitting layer units in series. The lower portion of the pixel defining layer 430 has an angle smaller than 90° with respect to the first electrode 420 (generally, anode), and has a capillary structure character. When inkjet printing ink droplets of the organic light-emitting material, the droplets can spread more evenly under the attraction of the capillary structures. Meantime, even there is coffee ring effect due to the unevenness at the edge, it can also be blocked by the structures protruding from the middle portions upon emitting light, the brightness of the effective emitting area is still relatively even, and thus the display quality is improved. In one embodiment, the thickness of the organic light-emitting layer 440 is not smaller than the height of the widest position at the middle portion of the pixel defining layer 430, by doing so, when the second electrode (generally, cathode) is made in the following process, the layer-broken phenomenon in the second electrode can be avoided without providing too much material for the second electrode to make the thickness of the second electrode sufficient thick to fill the concave portions between the pixel defining layers 430, the material for the second electrode is saved, and because the second electrode can be made thinner, the transmissivity can be improved.

Figure 4H:
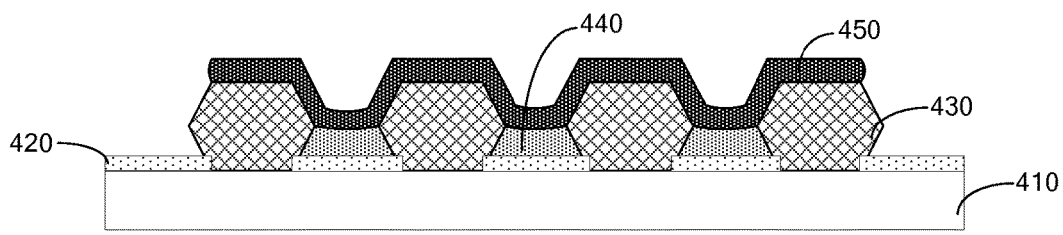
FIG. 4h is a schematic view for illustrating a structure of an OLED display device formed in a method for manufacturing an OLED display device according to an embodiment of the present disclosure.

Step S340, as shown in FIG. 4*h*, forming the second electrode 450 at least on the organic light-emitting layers 440, and thus finally forming the OLED display device.

Figure 5:
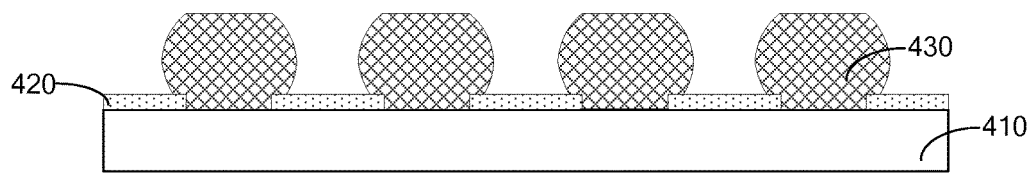
FIG. 5 is a schematic view for illustrating a structure of cross sections of pixel defining layers which each are in another cross sectional shape and are formed in a method according to an embodiment of the present disclosure.
Figure 6:
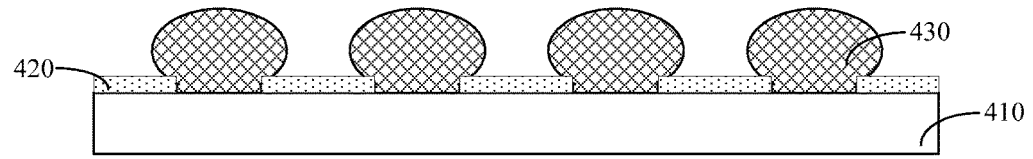
FIG. 6 is a schematic view for illustrating a structure of cross sections of pixel defining layers which each have still another cross sectional shape (oval) and are formed in method according to an embodiment of the present disclosure.

In the above manufacturing method, by controlling the light upon exposure, or by controlling any error occurring, the formed shape of the cross section of the pixel defining layer is shown in FIG. 5 and FIG. 6. In FIG. 5, sides of the cross section of the pixel defining layer 430, except the upper and lower sides, all are convex arcs towards the outside. In FIG. 6, the cross section 430 of the pixel defining layer 430 is approximately an oval. Of course, there may be a stepped transition between the widest position at the middle portion to two ends.

At least one embodiment of the present disclosure further provides an OLED display device comprising an array of first electrodes, pixel defining layers, organic light-emitting layers and a second electrode on a base substrate. The pixel defining layers are respectively arranged between the first electrodes, and the organic light-emitting layers and the second electrode are arranged in order on the array of the first electrodes. A width of a cross section of each pixel defining layer is relatively larger at a middle portion and reduced gradually towards an upper portion and a lower portion.

In one embodiment, the thickness of the organic light-emitting layer is not smaller than the height of the widest position at the middle portion of the pixel defining layer. In various embodiments, the surfaces from the widest position at the middle portion of the pixel defining layer to the respective upper and lower portions can be flat surfaces or curved surfaces, or be of ladder shape. The case that the surfaces from the widest position at the middle portion of the pixel defining layer to the respective upper and lower portions are flat surfaces can be shown in FIG. 4d, and the cross section of the pixel defining layer can be of an approximate hexagonal shape or a hexagonal shape. When the surfaces from the widest position at the middle portion of the pixel defining layer to the respective upper and lower portions are curved surfaces, the cross section of the pixel defining layer can be the pattern shown in FIG. 5 or FIG. 6. In addition, the surfaces from the widest position at the middle portion of the pixel defining layer to the respective upper and lower portions can also be of a ladder shape, as long as the width of the cross section of the pixel defining layer meets the tendency of being large at the middle portion and reduced successively towards the upper and lower portions. FIG. 4h shows the structures on the planarization layer only. In FIG. 4h, the thickness of the pixel defining layer can be from 0.1 μm to 100 μm, e.g. from 1 μm to 5 μm. The material for the pixel defining layers can be resin, polyimide, organic silicon, $SiO_2$, or the like.

Generally, an array of thin film transistor (TFT) structures and a planarization layer thereon are provided on the base substrate, the array of the first electrodes are formed on the planarization layer and connected to the drain electrodes in the thin film transistor structures through via holes.

In the OLED display device according to the embodiments of the present disclosure, the width of the cross section of the pixel defining layer is relatively larger at the middle portion and reduced gradually towards the upper portion and the lower portion. That is to say, the lower portion of the pixel defining layer forms an angle smaller than 90° with respect to the first electrode (e.g. anode) and has capillary structures, thus in inkjet printing, the ink droplets of the organic light-emitting material can be spread more evenly under the attraction of the capillary structures. Meantime, even if there is a coffee ring effect due to its uneven edge, it can be blocked by the protruding structures at the middle portion upon emitting light, therefore, the brightness of the effective emitting area is still relatively even and the display quality can be improved. On the other hand, the pixel defining layer has a relative narrow upper portion, thus a certain slope angle is formed so that the thickness of the organic light-emitting layer just reaches the widest position at the middle portion of the pixel defining layer, thus the layer-broken defect in the second electrode (e.g. cathode) can be avoided upon depositing the cathode. Furthermore, the cathode can be made thinner, and this increases the transmissivity and reduces the cost of the material for the cathode.

At least one embodiment further provides a display apparatus comprising the above-mentioned OLED display device. The display apparatus can be any product or component having display function, such as, electronic paper, OLED display, digital photo frame, mobile phone, tablet computer, and so on.

The above embodiments are only used to describe the present disclosure and not limitative to the present disclosure; those skilled in the relevant art can make various variations and modifications without departing from the spirit and scope of the present disclosure; therefore, all equivalent technical solutions belong to the scope of the present disclosure; the scope of the present disclosure are defined by the claims.

The present application claims the priority of Chinese Patent Application No. 201410129206.4, filed on Apr. 1, 2014, which is hereby entirely incorporated by reference as a part of the present application.

What is claimed is:

1. A method for manufacturing an organic light-emitting diode (OLED) display device comprising:
    forming an array comprising first electrodes on a base substrate, wherein an area to which the first electrodes correspond is a display area;
    forming pixel defining layers in intervals, with each of the pixel defining layers disposed between two adjacent first electrodes so that a width of a cross section of each pixel defining layer is relatively larger at a middle portion and reduced gradually towards an upper portion and towards a lower portion, and a side surface of the lower portion of the pixel defining layer and an upper surface of the first electrode intersect with each other and form an angle smaller than 90° therebetween;
    forming organic light-emitting layers respectively on the first electrodes between the pixel defining layers; and
    forming a second electrode which is at least provided on the organic light-emitting layers,
    wherein each of the pixel defining layers is a single-layered structure and made of a same material, and
    a thickness of each of the organic light-emitting layers formed is not smaller than a height of a widest position at the middle portion of each of the pixel defining layers;
    wherein the forming the pixel defining layers comprises:
    forming a photoresist on the base substrate on which the first electrodes are formed;
    irradiating light, which passes through a mask plate, on the photoresist at a predetermined first incident angle with respect to a direction perpendicular to the base substrate, to perform first exposure to the photoresist; and
    irradiating light, which passes through the mask plate, onto the photoresist at a predetermined second incident angle with respect to the direction perpendicular to the base substrate, to perform second exposure to the photoresist, and developing to remove the photoresist corresponding to the display area and hence exposing the first electrodes, wherein lines in which an incident direction of the light in the first exposure is located and lines in which an incident direction of the light in the second exposure is located are respectively arranged on opposite sides of normal lines which respectively pass through centers of the first electrodes exposed, so that the width of the cross section of each pixel defining layer formed is relatively larger at the middle portion and reduced gradually towards the upper portion and towards the lower portion, and the predetermined first incident angle and the predetermined second incident angle are both larger than 0° and smaller than 90°.

2. The method for manufacturing the OLED display device according to claim 1, wherein the lines in which the incident direction of the light in the first exposure is located and the lines in which the incident direction of the light in the second exposure is located are symmetrical with respect to normal lines which respectively pass through the centers of the first electrodes exposed, correspondingly.

3. The method for manufacturing the OLED display device according to claim 1, wherein a thickness of each of the pixel defining layers is from 0.1 μm to 100 μm.

4. The method for manufacturing the OLED display device according to claim 3, wherein the thickness of the pixel defining layer is from 1 μm to 5 μm.

5. The method for manufacturing the OLED display device according to claim 1, wherein surfaces from a widest position of the middle portion of each pixel defining layer to the upper portion and the lower portion respectively are flat surfaces or curved surfaces, or of ladder shapes.

6. The method for manufacturing the OLED display device according to claim 1, wherein the cross section of each of the pixel defining layers is hexagonal or oval.

7. A method for manufacturing an organic light-emitting diode (OLED) display device comprising:
    forming an array comprising first electrodes on a base substrate, wherein an area to which the first electrodes correspond is a display area;
    forming pixel defining layers in intervals, with each of the pixel defining layers disposed between two adjacent first electrodes so that a width of a cross section of each pixel defining layer is relatively larger at a middle portion and reduced gradually towards an upper portion and towards a lower portion, and a side surface of the lower portion of the pixel defining layer and an upper surface of the first electrode intersect with each other and form an angle smaller than 90° therebetween;
    forming organic light-emitting layers respectively on the first electrodes between the pixel defining layers; and
    forming a second electrode which is at least provided on the organic light-emitting layers,
    wherein each of the pixel defining layers is a single-layered structure and made of a same material, and a thickness of each of the organic light-emitting layers formed is not smaller than a height of a widest position at the middle portion of each of the pixel defining layers;
    wherein the forming the pixel defining layers comprises:
    forming a photoresist on the base substrate on which the first electrodes are formed;
    diffracting light after the light passes through light through holes of a mask plate, and irradiating the light diffracted onto the photoresist corresponding to the display area to perform first exposure to the photoresist, so that a cross section of unexposed photoresist has a shape of inverted trapezoids; and
    irradiating the photoresist, the cross section of which has a shape of inverted trapezoids, in areas corresponding to two base angles at an upper bottom of the respective inverted trapezoids, to perform second exposure to the photoresist, so that the width of the cross section of each pixel defining layer formed after development is relatively larger at the middle portion and reduced gradually towards the upper portion and towards the lower portion.

8. The method for manufacturing the OLED display device according to claim 7, wherein a thickness of each of the pixel defining layers is from 0.1 um to 100 um.

9. The method for manufacturing the OLED display device according to claim 8, wherein the thickness of the pixel defining layer is from 1 um to 5 um.

10. The method for manufacturing the OLED display device according to claim 7, wherein surfaces from a widest position of the middle portion of each pixel defining layer to the upper portion and the lower portion respectively are flat surfaces or curved surfaces, or of ladder shapes.

11. The method for manufacturing the OLED display device according to claim 7, wherein the cross section of each of the pixel defining layers is hexagonal or oval.

* * * * *